(12) United States Patent  
Vanderberg et al.

(10) Patent No.: US 8,237,135 B2  
(45) Date of Patent: Aug. 7, 2012

(54) ENHANCED LOW ENERGY ION BEAM TRANSPORT IN ION IMPLANTATION

(75) Inventors: Bo H. Vanderberg, Gloucester, MA (US); William F. DiVergilio, Brookline, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 467 days.

(21) Appl. No.: 12/357,973

(22) Filed: Jan. 22, 2009

(65) Prior Publication Data

US 2010/0181499 A1 Jul. 22, 2010

(51) Int. Cl.  
*A61N 5/00* (2006.01)  
*G21G 5/00* (2006.01)

(52) U.S. Cl. ............ 250/492.3; 250/492.21; 250/492.2; 250/423 R; 250/424

(58) Field of Classification Search .............. 250/492.3, 250/492.21, 492.2, 423 R, 424  
See application file for complete search history.

(56) References Cited

U.S. PATENT DOCUMENTS

| 5,959,305 A * | 9/1999 | Mack et al. ............. 250/492.21 |
| 2002/0014587 A1* | 2/2002 | Benveniste et al. ........... 250/290 |
| 2009/0026390 A1* | 1/2009 | Benveniste et al. ...... 250/492.21 |

FOREIGN PATENT DOCUMENTS

WO    WO 2004/114358    * 12/2004

* cited by examiner

*Primary Examiner* — Jack Berman  
*Assistant Examiner* — Meenakshi Sahu  
(74) *Attorney, Agent, or Firm* — Eschweiler & Associates, LLC

(57) ABSTRACT

An ion implantation method and system that incorporate beam neutralization to mitigate beam blowup, which can be particularly problematic in low-energy, high-current ion beams. The beam neutralization component can be located in the system where blowup is likely to occur. The neutralization component includes a varying energizing field generating component that generates plasma that neutralizes the ion beam and thereby mitigates beam blowup. The energizing field is generated with varying frequency and/or field strength in order to maintain the neutralizing plasma while mitigating the creation of plasma sheaths that reduce the effects of the neutralizing plasma.

19 Claims, 6 Drawing Sheets

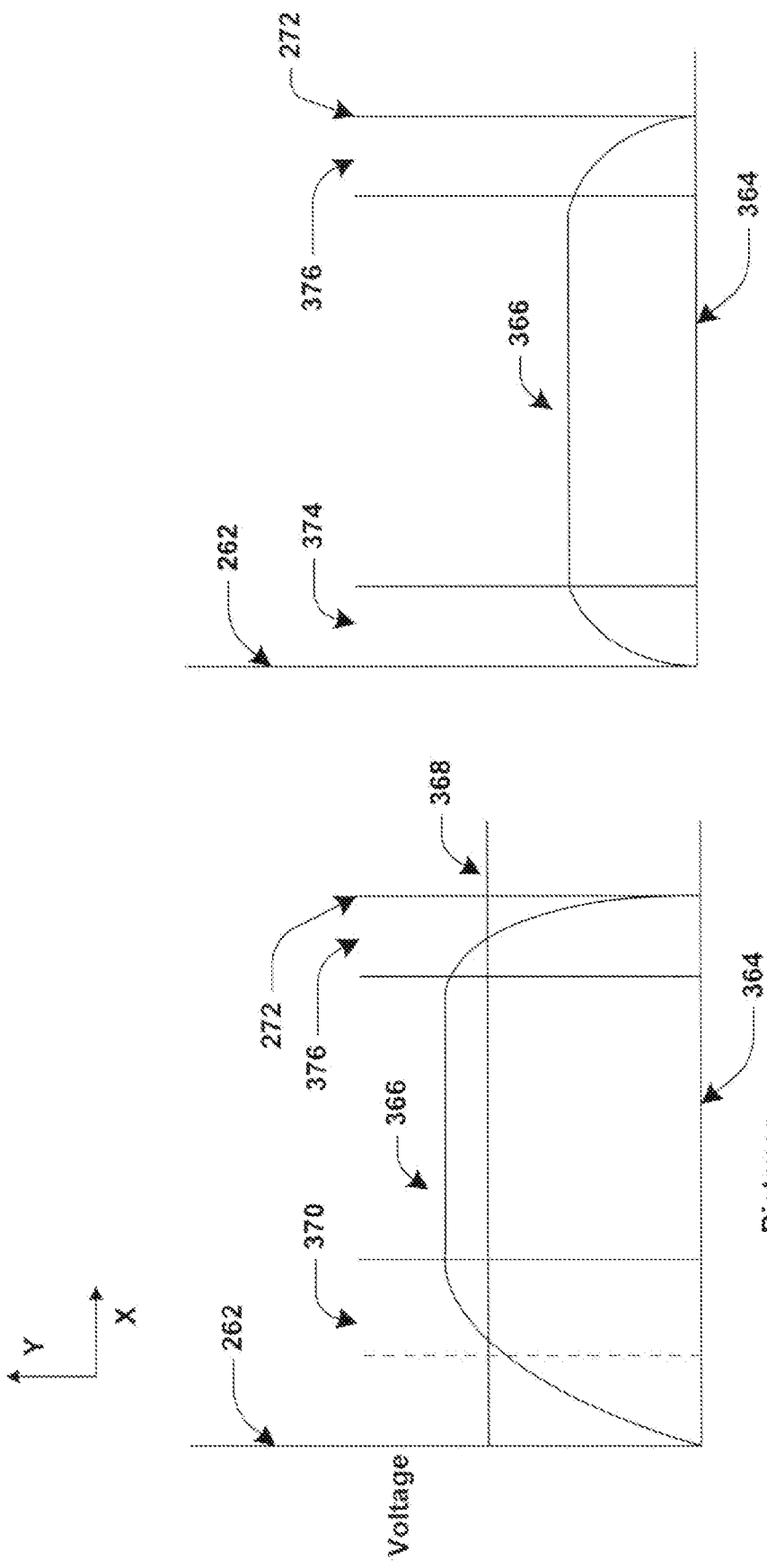

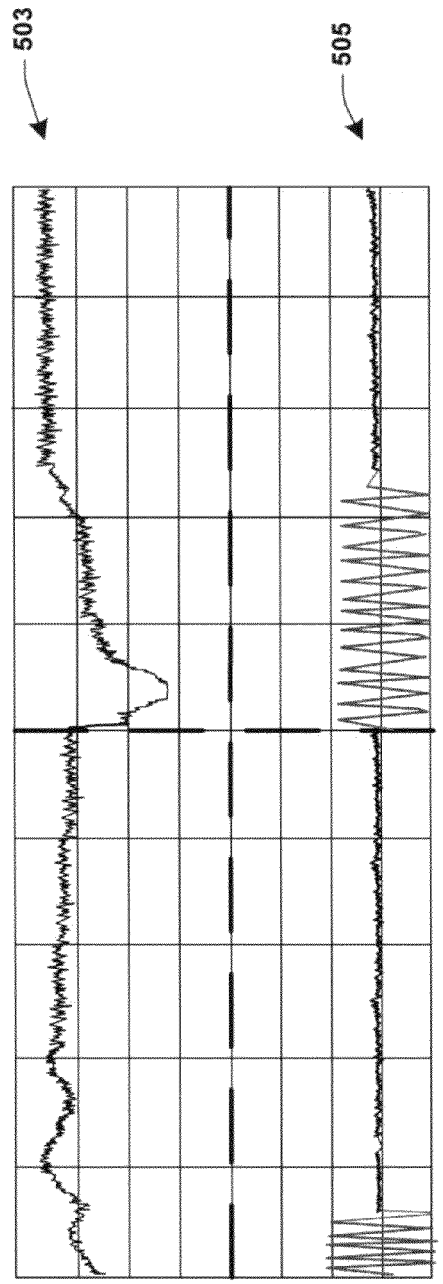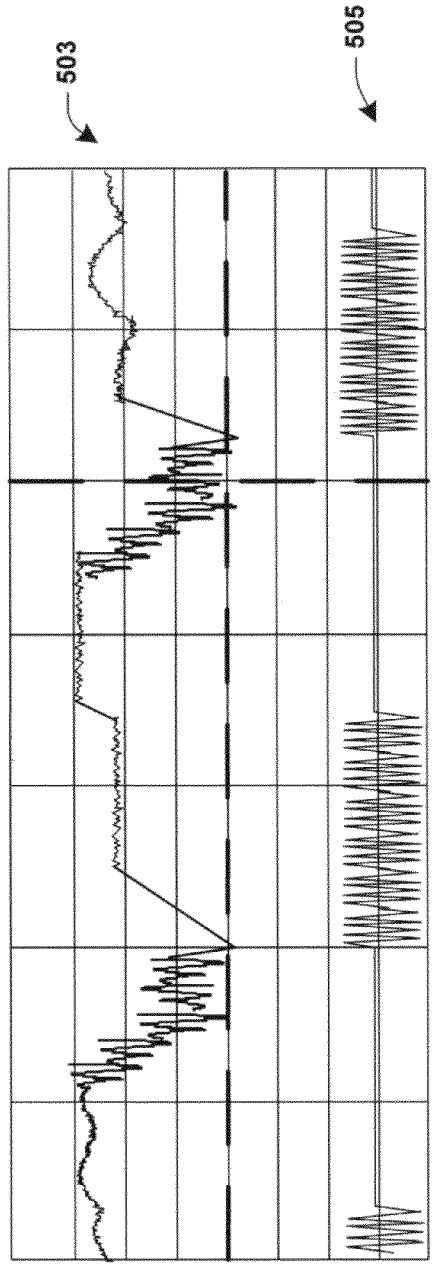

ENHANCED LOW ENERGY ION BEAM TRANSPORT IN ION IMPLANTATION

FIELD

The present disclosure relates generally to ion implantation systems, and more particularly to controlling an ion beam in an ion implanter.

BACKGROUND

Typical ion beam implanters include an ion source for generating positively charged ions from source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway can be evacuated to reduce the probability of ions being deflected from the predetermined beam path as a result of collisions with residual gas molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight can be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

For shallow depth ion implantation, high current, low energy ion beams are desirable. In this case, the reduced energies of the ions cause some difficulties in maintaining convergence of the ion beam due to the mutual repulsion of ions bearing a like charge. High current ion beams typically include a high concentration of similarly charged ions which tend to diverge due to mutual repulsion.

To maintain low energy, high current ion beam integrity at low pressures, a plasma may be created to surround the ion beam. Ion beams typically propagate through a weak plasma that is a byproduct of the beam interactions with the residual or background gas. This plasma tends to neutralize the space charge of the ion beam, thereby largely eliminating transverse electric fields that would otherwise disperse the beam.

In ion implantation systems, there remains a need for a beam containment apparatus and methodologies for use with high current, low energy ion beams which may be operated at low pressures and provide uniform beam containment along the length of a mass analyzer beam guide.

SUMMARY

The following presents a simplified summary in order to provide a basic understanding of some aspects of the disclosure. This summary is not an extensive overview. It is intended neither to identify key or critical elements nor to delineate the scope of the disclosure. Rather, its primary purpose is merely to present one or more concepts in a simplified form as a prelude to the more detailed description that is presented later.

One well-known problem with low-energy, high-current ion beams is the phenomenon of "beam blowup." High-current ion beams are comprised of many like-charged particles in close proximity, resulting in a repulsive force that may push the ions apart in a radial direction. Further, beam blowup can be exacerbated where the low energy implant is also performed at a high current, where many like charged particles are moving in the same direction relatively slowly (e.g., low energy). In this situation, there is an abundance of repulsive forces among the particles due to heightened beam particle density, and also less momentum to keep the particles moving in the direction of the beam path. As a result, low-energy, high-current ion beams often exhibit an expansion of diameter, resulting in an undesirably unfocused ion beam.

Beam blowup can be reduced by passing the ion beam through a neutralizing agent, such as an electron cloud contained inside a plasma. A plasma suitable for this function can be generated by exposing a gas to an energizing electric field. The gas may be energized into a charged plasma such that the negative charge of its electrons balances the positive charge of the ions comprising the ion beam. This exposure generates a neutralizing plasma through which the beam can be passed to reduce space-charge effects and thereby mitigate beam blowup.

One problem with this solution is that the energizing field used to produce the plasma may create plasma sheaths, which are regions in which the density of neutralizing electrons is comparatively low. A portion of the ion beam that passes through a plasma sheath will therefore not undergo neutralization and will continue to exhibit beam blowup. In one embodiment, this effect may be reduced by altering the generation of the energizing field. Rather than producing the energizing field at a static intensity, the system may variously generate the energizing field at different intensities and/or frequencies so as to maintain the plasma state of the neutralizing plasma while reducing the plasma sheath effect. In this way, the beam blowup exacerbation effect of the plasma sheaths may be reduced.

In one embodiment, an ion implantation system comprises a pulsed plasma generator that functions as a beam neutralization component to mitigate beam blowup, which can be particularly problematic in high current, low energy beams. The pulsed plasma generator can be located in any region in the system free of applied electric fields where blowup is likely to occur. The pulsed plasma generator includes a component for varyingly generating an energizing field that generates plasma that neutralizes the ion beam and thereby mitigates beam blowup. The energizing field generating component can be used as needed to maintain a sufficient level of plasma for desired beam containment, while concurrently mitigating plasma sheath effects by reducing or turning off the energizing field at other times.

To the accomplishment of the foregoing and related ends, the following description and annexed drawings set forth in detail certain illustrative aspects and implementations. These are indicative of but a few of the various ways in which one or more aspects may be employed. Other aspects, advantages and novel features will become apparent from the following detailed description when considered in conjunction with the annexed drawings.

BRIEF DESCRIPTION OF THE DRAWINGS

FIG. 3a is a diagram illustrating an example voltage distribution in a neutralization component during energization.

FIG. 3b is a diagram illustrating an example voltage distribution in a neutralization component during an "after glow" period after energization.

FIGS. 4 and 5 are examplary plots of beam current and energizing fields in a neutralization component.

DETAILED DESCRIPTION

Figure 1:
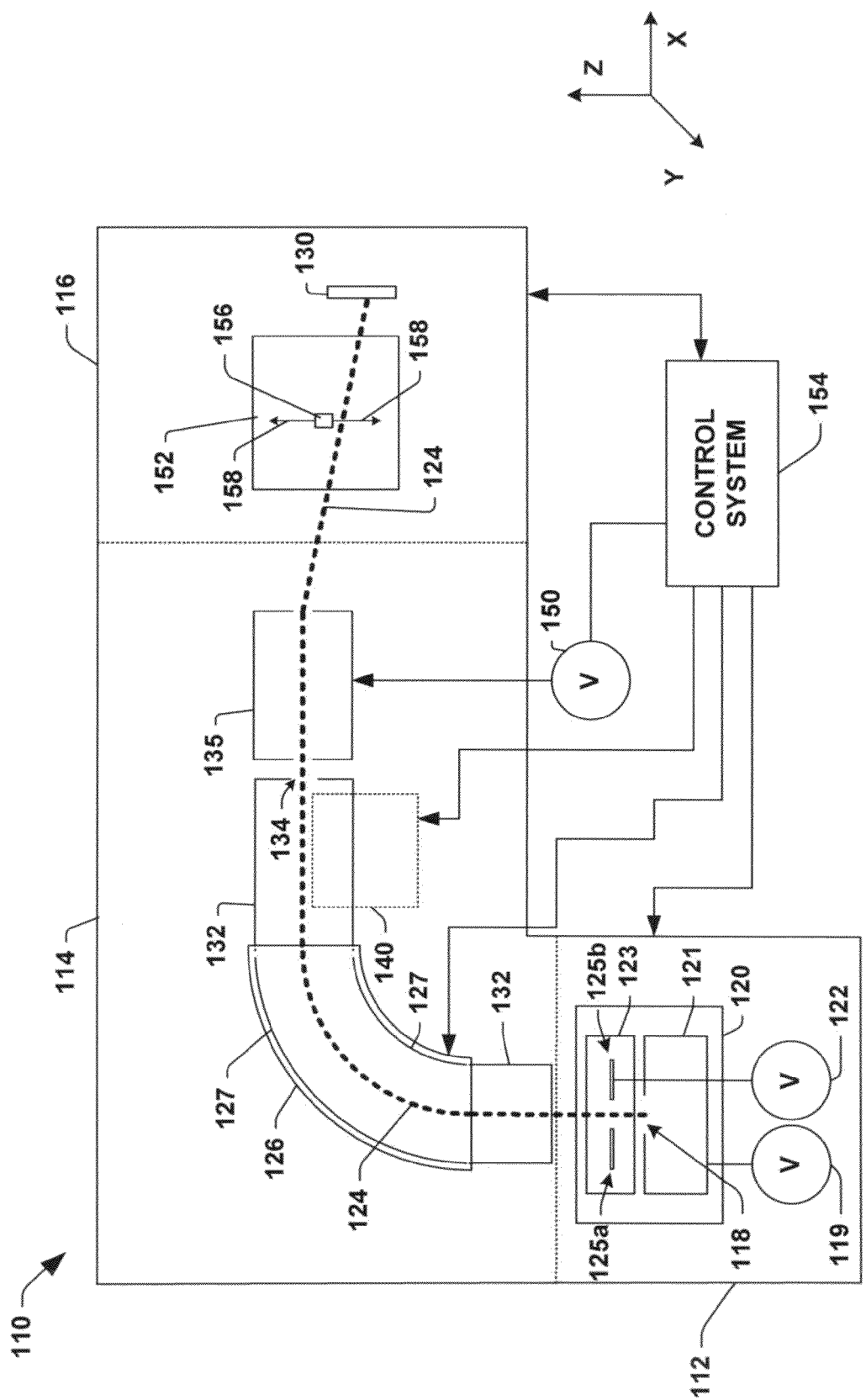
FIG. 1 is a block diagram illustrating an exemplary ion implantation system that includes a neutralization component as described herein.

One or more aspects are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present disclosure. It may be evident, however, to one skilled in the art that one or more aspects may be practiced with a lesser degree of these specific details. In other instances, well-known structures and devices are shown in block diagram form in order to facilitate describing one or more aspects.

As alluded to above, in semiconductor fabrication processing, semiconductor wafers or workpieces are implanted with charged particles or ions. The use of a low-energy, high-current beam is advantageous for shallow doping, which has application to miniaturized components, but such ion beams may be hampered by beam blowup. Accordingly, the disclosure herein provides an ion implantation system and method that includes a pulsed plasma generator that mitigates beam blowup even in high current, low energy implants.

FIG. 1 illustrates an exemplary ion implantation system 110 that includes a neutralization component to mitigate beam blowup. The system 110 has a terminal 112, a beamline assembly 114, and an end station 116. The terminal 112 includes an ion beam source 120 powered by an ion source power supply 119. The ion source 120 generates charged ions that are extracted and formed into the ion beam 124, which is directed along a beam path in the beamline assembly 114 to the end station 116.

To generate the ions, a gas of a dopant material (not shown) to be ionized is located within a generation chamber 121 of the ion beam source 120. The dopant gas can, for example, be fed into the chamber 121 from a gas source (not shown). In addition to the ion source power supply 119, it will be appreciated that any number of suitable mechanisms (not shown) can be used to excite free electrons within the ion generation chamber 121, such as RF or microwave excitation sources, electron beam injection sources, electromagnetic sources and/or a cathode which creates an arc discharge within the chamber, for example. The excited electrons collide with the dopant gas molecules and ions are generated thereby. Generally, positive ions are generated, although the disclosure herein is applicable to systems wherein negative ions are generated as well.

The ions are controllably extracted through a slit 118 in the chamber 121 by an ion extraction assembly 123, which comprises a plurality of extraction and/or suppression electrodes 125a, 125b. The extraction assembly 123 may include an extraction power supply 122 to bias the extraction and/or suppression electrodes 125a, 125b to accelerate the ions from the generation chamber 121.

It can be appreciated that since the ion beam 124 comprises like-charged particles, the beam may have a tendency to blow up or expand radially outwardly as the like charged particles repel one another. It can also be appreciated that beam blowup can be exacerbated in low-energy, high-current beams, where many like charged particles are moving in the same direction relatively slowly such that there is an abundance of repulsive forces among the particles, but little particle momentum to keep the particles moving in the direction of the beam path. Accordingly, the extraction assembly 123 is generally configured such that the beam is extracted at a high energy so that the beam does not blow up (i.e. so that the particles have sufficient momentum to overcome repulsive forces that can lead to beam blowup). Moreover, it is generally advantageous to transfer the beam 124 at a relatively high energy throughout the system which is reduced just before the workpiece 130 to promote beam containment. It can also be advantageous to generate and transport molecular or cluster ions which can be transported at a relatively high energy but are implanted with a lower equivalent energy, since the energy of the molecule or cluster is divided amongst the dopant atoms of the molecule.

The beamline assembly 114 has a beam guide 132, a mass analyzer 126, a beam defining component 135, and a neutralization component 140 that can act as a pulsed plasma generator, for example. The mass analyzer 126 is formed at about a ninety degree angle and comprises one or more magnets (not shown) that serve to establish a (dipole) magnetic field therein. As the beam 124 enters the mass analyzer 126, it is correspondingly bent by the magnetic field such that ions of an inappropriate charge-to-mass ratio are rejected. More particularly, ions having too great or too small a charge-to-mass ratio are deflected into side walls 127 of the mass analyzer 126. In this manner, the mass analyzer 126 merely allows ions in the beam 124 that have the desired charge-to-mass ratio to pass there-through and exit through a resolving aperture 134. It will be appreciated that ion beam collisions with other particles in the system 110 can degrade beam integrity. Accordingly, one or more pumps (not shown) may be included to evacuate, at least, the beam guide 132.

The beam defining component 135 includes elements for defining the beam, such as by scanning, focusing, adjusting the beam energy, deflect and/or steering (not shown), where one or more beam defining power supplies 150 are operatively coupled to the beam defining element 135 to bias elements (e.g., electrodes) therein. The beam defining component 135 receives the mass analyzed ion beam 124 having a relatively narrow profile (e.g., a "pencil" beam in the illustrated system 110), and a voltage applied by the beam defining power supply 150 operates to scan, focus, energy-adjust, deflect and/or steer the beam. The beam defining component 135 may, for example, be operated as provided in U.S. Pat. No. 7,064,340 to Vanderberg et al. and/or U.S. Pat. No. 6,777, 696 to Rathmell et al. the entirety of which is hereby incorporated herein by reference. Additionally, the beam defining component 135 may comprise electrostatic deflection plates (e.g., one or more pairs thereof), as well as an Einzel lens, quadrupoles and/or other elements. Although not necessary, it can be advantageous to apply voltages to deflecting plates so that they average to zero, to avoid having to introduce additional elements to mitigate distortion.

The end station 116 in the illustrated example is a "serial" type end station that supports a single workpiece 130 along the beam path for implantation, although any number of different end stations can be embodied. A dosimetry system 152 can be comprised within the end station 116 near the workpiece location for calibration measurements prior to implantation operations. During calibration, the beam 124 passes through dosimetry system 152. The dosimetry system 152 includes one or more profilers 156 that may continuously traverse a profiler path 158, thereby measuring the profile of the scanned beams. The profiler 156 may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The dosimetry system can measure one or more ion implantation characteristics, such as beam current and/or size.

The dosimetry system 152 can be operably coupled to the control system 154 to receive command signals therefrom and to provide measurement values thereto. For example, the control system 154, which may comprise a computer, microprocessor, etc., may be operable to accept the measurements of one or more ion implantation characteristics provided by the dosimetry system 152, and may calculate, for example, an average beam current and/or energy. The control system 154 can also be operatively coupled to the terminal 112 from which the beam of ions is generated, the mass analyzer 126 of the beamline assembly 114, the beam defining component 135 (e.g., via the beam defining power supply 150), and/or the neutralization component 140. Accordingly, any or all of these elements can be adjusted by the control system 154 to facilitate desired ion implantation based upon the measurements provided by the dosimetry system 152. One potential advantage of this operative coupling is the control of the pulsed plasma generator 140 in order to monitor and enhance the efficiency of the beam neutralization (e.g., by controlling the particulars of the energizing field pulsing and plasma generation). For example, the ion beam can initially be established according to predetermined beam tuning parameters (which can be stored/loaded into the control system 154). Then, based upon feedback about selected ion implantation characteristics provided by the dosimetry system 152, the power supplied to the neutralization component 140 can be varied as needed to control, for example, beam current and/or size.

Figure 2:
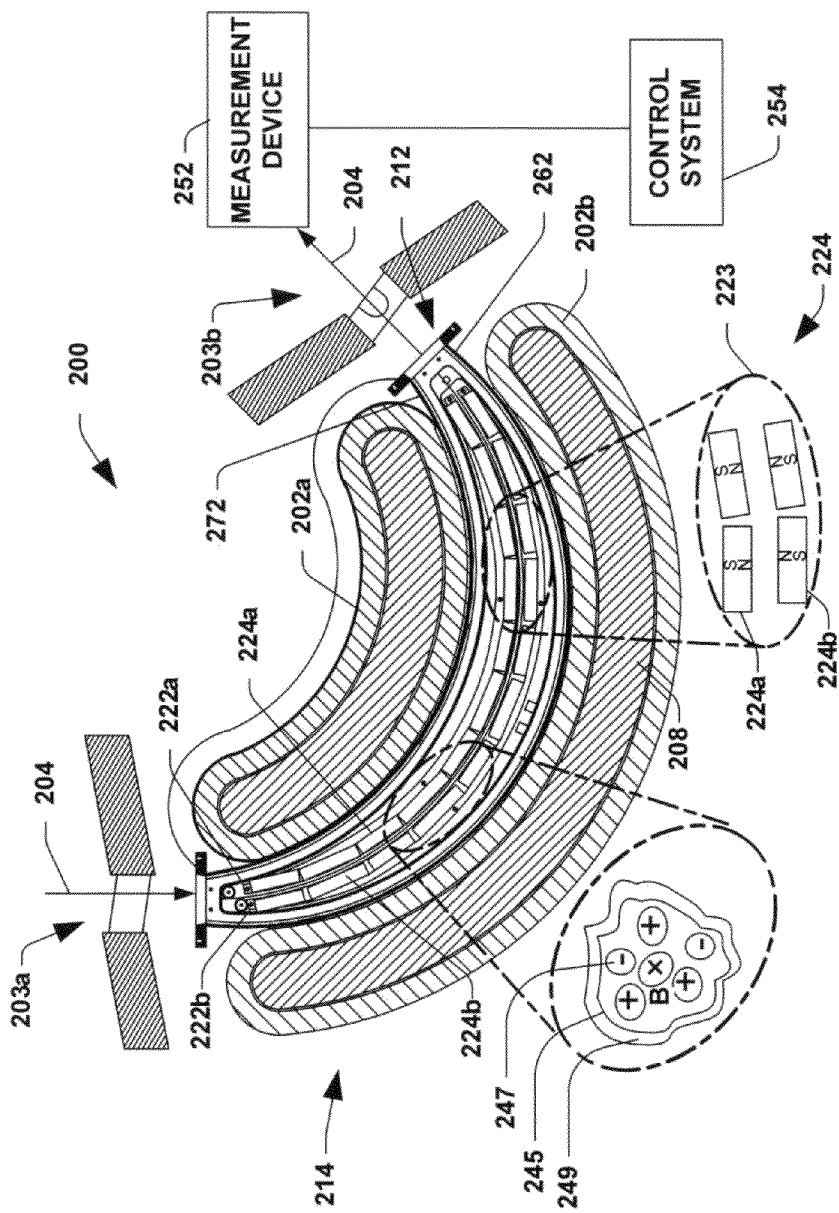
FIG. 2 illustrates an exemplary neutralization component

Turning to FIG. 2, illustrates a beam line of an ion implantation system 200 including a pulsed plasma generator that can function as the neutralization component 140 of FIG. 1. The pulsed plasma generator can be located near the beamguide 132 as illustrated in FIG. 1, but it can also be situated before or after the beam defining component 135. It will be appreciated, however, that the pulsed plasma generator may be situated at any one or more locations within the system 110 of FIG. 1 to facilitate desired beam plasma containment.

The pulsed plasma generator of the present example is housed in a mass analyzer whose cross-section is depicted in FIG. 2, with a pair of coils 202, wherein a first coil (or top coil 202a in the illustrated orientation) resides over a second coil (or bottom coil) 202b with a beam path 204 disposed therebetween and extending therethrough from an entrance end 203a to an exit end 203b, respectively. Each coil 202 extends in a width direction 206 at least as far as the width of the ion beam, and preferably further than the beam width. Each coil 202 may comprise an arcuately-shaped yoke 208 having one or more conductors wrapped therearound, for example, in a longitudinal direction along the arcuate shape of the yoke and generally parallel to the beam path 204. Upon current conducting through the coils 202, a dipole magnetic field B is generated between the coils in a direction generally perpendicular to a direction of propagation of the beam.

Referring to FIG. 2, the laterally extending coils 202 define laterally opposing sides 214 of the plasma generator 200. Disposed on one of the sides 214 and positioned between the coils 202a and 202b are arcuately extending sidewalls 262 and 272. Two arcuately extending conductive segments 222a and 222b can be located on the sidewalls. Although these segments are themselves conductive, the segments are electrically isolated from one another. On each segment 222a, 222b a plurality of electrodes 224a, 224b extend longitudinally along the arcuate path, wherein the electrodes 224 can be concatenated therealong. Although the electrodes 224 are illustrated as a plurality of separate elements connected together electrically via the respective segment 222, it should be understood that each electrode 224 may comprise a single, arcuately extending conductive element as well as other configurations, and such alternatives are contemplated as falling within the scope of the present disclosure.

The electrodes 224a and 224b are coupled to a power source (not shown) such as an RF power source such that upon biasing, and can form an energizing field component 224 to generate an electric field between the electrodes 224a and 224b in a direction that is generally perpendicular to the beam path 204. In one example, the electrodes 224a, 224b may be employed in conjunction with a dipole magnetic field B within a gap 212 (which is perpendicular to the electric field) to create electron trapping regions therein similar to a magnetron structure. The moving electrons collide with a gas (residual source gas or an input source gas such as xenon) for ionization thereof to generate a plasma. The gas source (not shown) selectively releases a gas to be ionized (e.g., as controlled by a controller 254), and the energizing field component 224 serves to generate a charged plasma 245 from this gas.

In one embodiment, the energizing field component can be an antenna, or any component capable of generating an energizing field that is an electric static field and/or an electromagnetic field that operates in one of a radiofrequency range and/or a microwave range. The energizing field component 224 may comprise an antenna, for example, where a high-amplitude energizing field (e.g., high amplitude magnetic field) is created around the antenna when the energizing field component 224 is powered. As one example, a radiofrequency (RF) antenna may be used to generate an electromagnetic field in the radiofrequency range and introduce energizing fields to an ion beam passing through (e.g., windows, antenna, and the like). In another instance, the energizing field component 224 may comprise an electrode biased with DC voltage to create a DC discharge. In another instance, a hot filament may be biased with DC to create a filament discharge. In yet another embodiment, the energizing component may be a microwave antenna.

In another aspect of the present invention, the electrodes 224 can also be magnets, wherein each magnet 224 has a north pole and a south pole associated therewith. For example, in the first segment 222a within the enlarged region 223, the magnets have their poles aligned such that a north pole of each magnet faces inwardly toward a magnet 224b on the other conductive segment 222b, and has a south pole that faces outwardly away from the other magnet 224b. Further, in the second segment 222b, the magnets similarly have their poles aligned, however, the north pole of each magnet 224b faces inwardly toward a magnet 224a on the first conductive segment 222a, and has a south pole that faces outwardly away from the magnet 224a. With such a configuration, the magnets can generate magnetic cusp fields that extend into the arcuate passageway toward the beam path 204. Although one configuration is illustrated in FIG. 2, it should be understood that the magnet pole orientations may alternatively be moved, wherein the configuration of south poles and north poles generates a magnetic cusp field, and any such a variation is contemplated by the present invention.

The magnetic cusp magnetic fields generated by the magnets 224 have portions that are perpendicular to the electric fields generated by the electrodes 224. By using the electrodes with magnets the magnetic cusp fields can be tailored to maximize ionization efficiency without impacting the mass analysis function of the magnetic dipole field B therein, as may be appreciated. In addition, by using the electrodes with magnets (similar structure for both the electric field generator and the magnetic field generator), the design can be simplified.

The plasma generated within the plasma generator may readily flow along magnetic field lines, such as the field lines associated with the dipole field B. Thus the generated plasma is formed along the arcuate passageway in a relatively uniform manner and may then readily diffuse across the width of the beam guide along dipole field lines to provide substantially a uniform plasma across with width of the ribbon beam. Thus space charge neutralization of the beam may occur advantageously uniformly across a width thereof.

The plasma discharge 245 can comprise two qualitatively different regions: a quasi neutral, equipotential conductive plasma body 247 and a boundary layer called a plasma sheath 249. The plasma body comprises a plurality of mobile charge carriers (as illustrated within the plasma body) and thus is a conductive medium. Its interior generally has a uniform electric potential. A plasma does not exist for long in direct contact with material objects and rapidly separates itself from objects by forming a non-neutral sheath 249. The sheath is an electron deficient, poorly conductive region having a strong electric field. The plasma body can be beneficial at low energies because the electrons are neutralizing the space-charge of a positive ion beam 204 passing therethrough. Consequently, the beam does not blow up as much and allows more efficient beam transport.

In one embodiment, the plasma discharge can be varied periodically with a given frequency and duty cycle. The plasma discharge can be varying according to any controlled manner that controls a time-dependence of the plasma discharge energized by control system 254 (e.g., a controller and/or software system). For example, the duty cycle can determine the fraction of time that the pulsed plasma generator is operational in a discharge phase for energizing plasma, such as RF plasma. In one embodiment, the plasma discharge can be controlled according to RF pulses. For example, pulses of energizing fields can be generated according to different phases in which the energizing field component 224 (e.g., RF antenna) is operational.

In one embodiment, the energizing field component 224 can be configured to operate in a discharge phase, and be inhibited in an after glow phase in order to generate varying fields thereon. When operating during the discharge phase of the antenna, the energizing field component 224 is configured to generate high amplitude electric fields surrounding the surfaces of the energizing field component 224 for a predetermined time. In one embodiment, the predetermined time in which the antenna is operational can be a function of plasma density, as measured by a measurement device 252 and signaled to the control system 254 for controlling operation. In another example, the predetermined time may be a function of beam current, and/or any other characteristic property of the beam and/or plasma discharge therein.

In one embodiment, the pulsed plasma generator comprises a plasma confinement component, such as a cusp confinement system, comprising one or more cusp field elements 224a, 224b. For example, cusp magnets may help to spatially retain the generated plasma, thereby extending plasma retention times. Cusp magnets within the pulsed plasma generator can reduce the diffusion of the plasma 245 to the walls (e.g., wall 272, and wall 262) of the generator and therefore prolong the after glow period. A longer predetermined time for the after glow period can reduce duty cycles for the RF plasma generated and enhance beam current.

A gas source (not shown), energizing field generating component 224 and one or more optional cusp field element 224a, 224b may be located anywhere within the implantation system. Regardless of the walls or boundaries around the neutralizing plasma, some of the plasma can be lost to these surrounding surfaces. Populating these surrounding surfaces with the cusp magnets 243 can facilitate containment of the plasma. Beam blow up can be mitigated because the spatial distribution of fast ions of the beam 204 equilibrates with the spatial distribution of particles of the neutralizing plasma such that plasma neutrality is relatively maintained and a field-free region is established. The space-charge of the ion beam is thus compensated by the plasma electrons and beam blowup is thereby mitigated.

It can be appreciated that plasma sheaths can develop in close proximity to the energizing field component 224. Such sheaths can inhibit the mitigation of beam blow up because they generally comprise regions with highly reduced electron density, and thus lack neutrality and contain substantial electric fields (see, for example, Lieberman and Lichtenberg, Principles of Plasma Discharges and Materials Processing, Chapter 6 incorporated in its entirety herein by reference). In non-magnetized discharges, the sheath voltage is a function of the voltage of the energizing electrode such that the highest plasma potential is higher than the highest electrode voltage; the electric field in the sheath increases with sheath voltage.

This effect is illustrated in FIG. 3a and FIG. 3b, both for a discharge phase of energizing field generation (FIG. 3a) and an "after glow" phase (FIG. 3b), which is a period of time wherein the plasma slowly wanes after power has been disconnected from the energizing field component 224 of FIG. 2. In these figures, the X axis 364 represents the distance of a point in the chamber from the chamber wall 262 (lying on the Y-axis) nearest the energizing field component towards the chamber wall 272 farthest from the energizing component 224 (as shown in FIG. 2). The Y axis represents the local voltage in the plasma. FIG. 3a also illustrates the voltage distribution inside the plasma 366 in relation to the voltage of the energizing component 368. FIG. 3a further illustrates that the field generated during energization has two regions of relatively high electric field: the region 370 around the energizing component, and the region 376 around the wall 272 that is farthest from the energizing component. The electric field in these areas arises due to a more sparsely generated neutralizing plasma, which contributes to beam blowup in these regions. It will be apparent that the activation of the energizing electrode exacerbates the size and magnitude of the plasma sheath in this region.

For the purpose of contrast, FIG. 3b illustrates plasma sheath regions 374, 376 of relatively small width at each of the chamber walls. These figures together illustrate the reduced plasma sheath effect near the energizing electrode 368 during the "after glow" period, as compared with the plasma sheath 374 created during activation of the energizing electrode 368. FIG. 3a also illustrates that the plasma voltage (or potential) 366 exceeds the voltage of the energizing electrode 368 by a small margin.

It will be appreciated that the pulsed plasma generator 300 and the fields generated thereby can remain on for a predetermined period of time to allow a sufficient density of plasma to accumulate. During the after glow period, the electric fields in the sheaths of the plasma are substantially lower than when the energizing field generating component is active, thereby reducing the blowup-exacerbating effect created by the plasma sheaths.

Turning now to FIGS. 4 and 5, illustrate respective plots of beam currents 502 as a function of time of an exemplary ion implanter comprising an energizing field component. In the plots the horizontal axes show time progressing, whereas the vertical axes show amplitudes of current and RF signals. In one embodiment RF signals 505 are pulsed as voltages/control signals. The duty cycle of the energizing component (not shown) can be determined by the beam current of the implanter used, thereby improving the plasma density and the time in which beam transmission is high. FIG. 4 and FIG. 5 illustrate different RF waveforms 505, and how beam current 503 can be increased with a plasma when RF fields 505 are turned on, then increases further when the RF fields are turned off until after a predetermined or given time the current drops to the RF field off values (e.g., when the plasma gas substantially disappears).

In one embodiment, the frequency and duration of pulses and the threshold value of the plasma density can be adjusted (e.g., by the controller 254) based upon, among other things, the ion beam species, the beam current, the beam energy, and the type of ion implanter, in order to enhance the time-averaged beam current and to promote the enhanced beam transport in the after glow phase. In addition, it will be appreciated that sheaths and/or undesired effects associated therewith may be mitigated by generating the energizing field varyingly as needed to maintain energizing of the gas into neutralizing plasma. Many patterns for varying the intensity of the energizing field may be suitable for this function. For example, the energizing field may be intermittently generated; or may be generated with an oscillating field strength; or may be generated at erratic intervals, and/or with erratic field strengths; or may be generated as a function of the density of the neutralizing plasma, e.g., with field strength inversely proportional to neutralizing plasma density. The frequency and duration of the energizing field can be adjusted as needed (e.g., by the controller 254 of FIG. 2) based upon, among other things, the ion beam species, the beam current, the beam energy, and the type of ion implanter, in order to enhance the time-averaged beam current and to promote the enhanced beam transport in the after glow period. In one embodiment, the power supplied to the energizing field component 224 may be pulsed to generate an intermittent energizing field.

Figure 6:
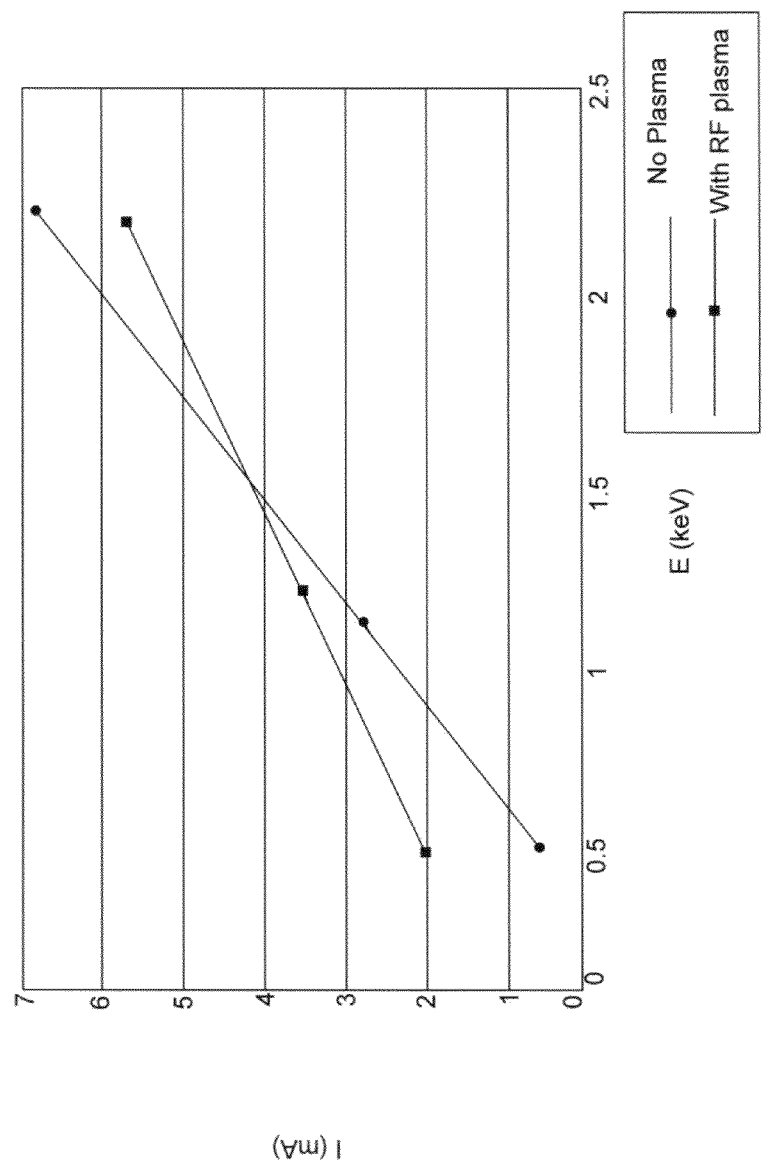
FIG. 6 is a chart illustrating current versus energy with RF plasma and without RF plasma.

Turning now to FIG. 6, illustrates a plot of the net ion beam current improved obtained with Boron ions, as one example. As discussed supra, various types of beam species may be utilized as well as Boron ions. FIG. 6 illustrates that below 1.5 keV beam energy the average beam current with pulsed plasma exceeds the current without plasma and thus advantageous to utilize the beam plasma neutralization methods embodied herein. The threshold energy for which RF plasma is useful can vary for different ion species and for different ion implantation systems.

Figure 7:
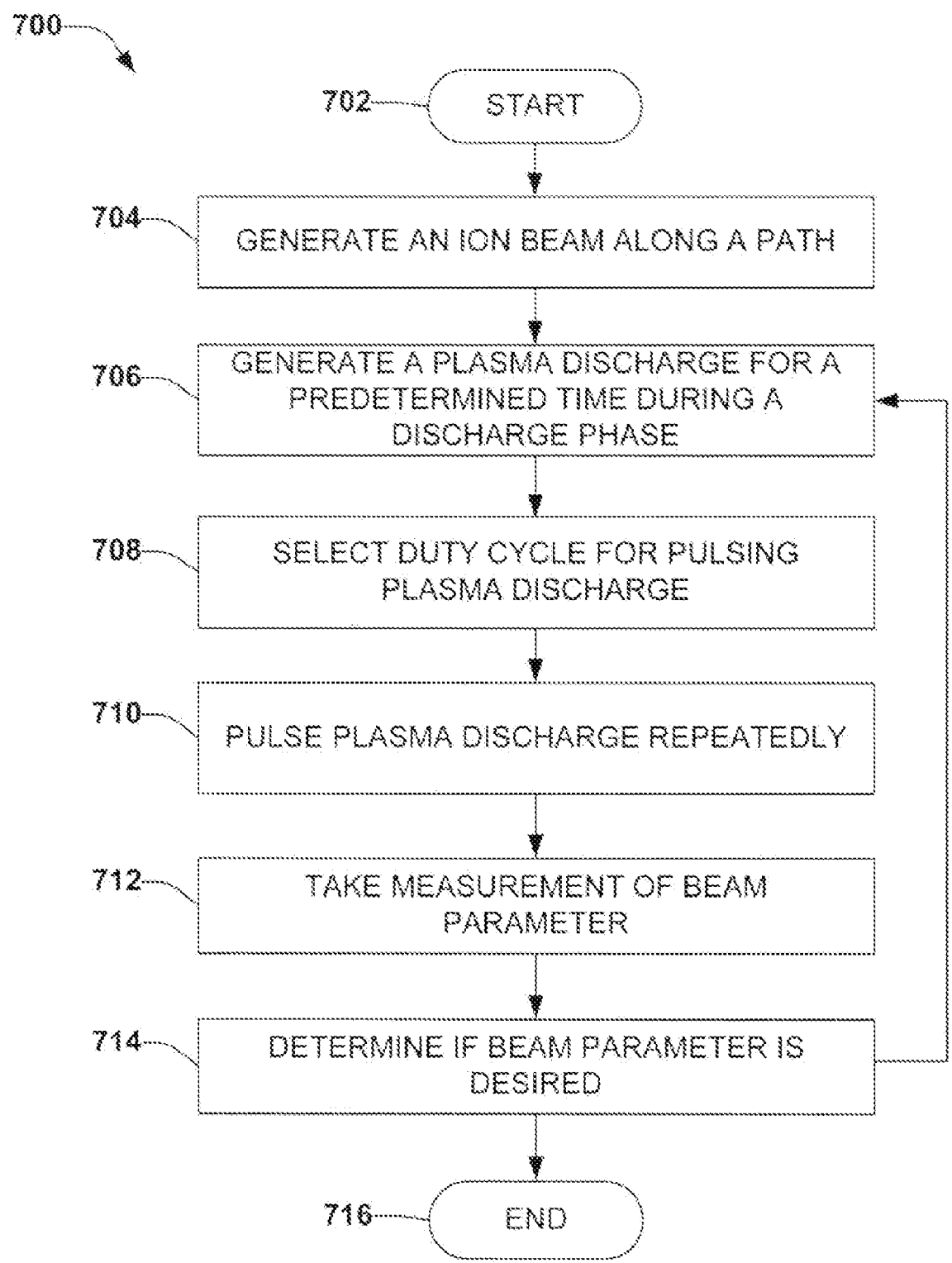
FIG. 7 is a block diagram of an exemplary method of beam transport in an ion implantation system.

Turning now to FIG. 7, illustrates a method 700 of implanting ions into a workpiece in an ion implantation system. Although the method 700 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method initializes at 702 and at 704 an ion beam is generated along a path in an ion implantation system by an ion source. Any ion source capable of generating an ion beam can be envisioned. At 706 a plasma discharge, such as an RF plasma discharge, is generated in any varying manner. For example, the plasma discharge can be directed to an ion beam passing through a pulsed plasma generator (as discussed supra) and generated in pulses so that the plasma is pulsed. In one embodiment, pulsing of the plasma discharge can be done intermittently for a predetermined time during a discharge phase.

In one embodiment, pulsing of the plasma discharge can be done in a predetermined time set by a duty cycle at 708. In one embodiment, the duty cycle can be a function of plasma density. For example, a controller (not shown) can govern the pulse cycles of an energizing field component (not shown) depending on measurements provided by a measuring device. The plasma density can therefore be monitored in order to adjust, and control the time predetermined by the controller for the discharge phase to occur. In another embodiment, the plasma discharge is not pulsed, but is intermittently generated to vary in intensity level. In addition, the predetermined time can be set by a duty cycle that can be a function of beam current. For example, once beam current passing below a certain threshold value the duty cycle may be shorter or zero. The same can be employed for other beam characteristics, such as species, charge, and/or energy, for example. The duty cycle can be selected for pulsing the plasma discharge. For example, a duty cycle (e.g., time-dependence) can be programmed and/or controlled to generate pulses in order for the plasma to change in density before reaching a critical low value.

At 710 the plasma discharge can be pulsed repeatedly in accordance with the selected duty cycle. In one embodiment, the method can inhibit plasma discharge to the ion beam in an after glow phase. This can be for a predetermined time in order for the plasma to change in density before reaching a critical low value. The after glow phase can comprise shutting down the energizing component and/or varying the fields therefrom to a lesser degree. Alternatively, the energizing component can be shut off for the predetermined time of the after glow phase.

At 712 measurements can be taken through a measurement component and provided to a controller for determining if the desired beam parameter has been achieved at 714. If the parameter being measured is not the desired value or range then the plasma discharge can be generated again at 706 and a duty cycle can be recalculated and determined again at 708 as the cycle repeats through additional iterations. The same cycle would ensure until finally the desired parameter values have been generated and the method finalizes at 716.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A plasma generator for use in a low energy beam line within an ion implantation system, comprising:
   a plasma energizing component configured to generate electric fields around the energizing component for a predetermined time during a discharge phase;
   a controller configured to activate the plasma energizing component for the predetermined time in the discharge phase and inhibit the energizing component in an after glow phase, wherein the predetermined time is a function of a measured plasma density value provided thereto, or a measured beam current value provided thereto.

2. The plasma generator of claim 1, further comprising cusp field elements for generating a cusp field therein and configured to lengthen the after glow phase of the energizing component.

3. The plasma generator of claim 1, wherein the energizing component is configured to generate pulsed energizing fields for a predetermined time to generate a plasma and enhance beam current of an ion beam passing therethrough.

4. The plasma generator of claim 1, wherein the after glow phase comprises a predetermined time that is a function of a plasma density.

5. The plasma generator of claim 1, wherein the activated energizing component promotes neutralization of ions of an ion beam by pulsing electric fields to generate a plasma, and wherein deactivation of the energizing component dampens electric fields imposed in the discharge phase and the generated plasma neutralizes the ion beam in the after glow phase.

6. An ion implantation system, comprising:
   an ion beam source configured to generate an ion beam;
   a mass analyzer for mass analyzing the ion beam generated;
   a pulsed plasma generator located downstream of the ion beam generator and configured to generate a pulsed plasma discharge to the ion beam passing therethrough, wherein the pulsed plasma generator is configured to generate pulses of the energizing field based on a duty cycle that is a function of beam current of the ion implantation system;
   an end station configured to support a workpiece that is to be implanted with ion by the ion beam.

7. The ion implantation system of claim 6, wherein the pulsed plasma generator is configured to generate pulses of the pulsed plasma discharge periodically with a duty cycle.

8. The ion implantation system of claim 6, wherein the pulsed plasma generator comprises:
   a gas source for providing gas particles, and
   an energizing component configured to generate pulses of an energizing field to excite the gas particles into the pulsed plasma discharge.

9. The ion implantation system of claim 8, wherein the energizing field is a static electric field or an electromagnetic field in one of a radiofrequency range and a microwave range.

10. The ion implantation system of claim 6, wherein the pulsed plasma generator comprises at least one magnetic cusp field element configured to generate magnetic cusp fields within the pulsed plasma generator to prolong an after glow phase.

11. The ion implantation system of claim 7, wherein the energizing field component comprises:
    an electrode,
    wherein the electrode generates the energizing field that ionizes the gas particles and produces the pulsed plasma discharge,
    wherein the pulsed plasma discharge comprises a neutralizing plasma that decreases space-charge effects acting on an ion beam below a low ion beam energy threshold.

12. The ion implantation system of claim 6, wherein the pulsed plasma generator is configured to neutralize the ion beam by reducing beam generated electric fields during a discharge phase, and to generate energizing fields during a predetermined time by generating the pulsed plasma discharge.

13. An ion implantation system, comprising:
    an ion beam source configured to generate an ion beam;
    a mass analyzer for mass analyzing the ion beam generated;
    a pulsed plasma generator located downstream of the ion beam generator and configured to generate a pulsed plasma discharge to the ion beam passing therethrough;
    an end station configured to support a workpiece that is to be implanted with ion by the ion beam,
    wherein the pulsed plasma generator is configured to prevent generation of energizing fields during a predetermined time in an after glow phase until a plasma density reaches a predetermined critical low value.

14. An ion implantation system, comprising:
    an ion beam source configured to generate an ion beam;
    a mass analyzer for mass analyzing the ion beam generated;
    a pulsed plasma generator located downstream of the ion beam generator and configured to generate a pulsed plasma discharge to the ion beam passing therethrough;
    an end station configured to support a workpiece that is to be implanted with ion by the ion beam;
    a measurement component configured to measure at least one ion implantation characteristic; and
    a controller operatively coupled to the measurement component and the pulsed plasma generator, wherein the controller adjusts the pulsed plasma generator in response to at least one ion implantation characteristic measurement including beam current.

15. A method of implanting ions into a workpiece in an ion implantation system, comprising:
    generating an ion beam in the ion implantation system;
    activating a plasma discharge generator to create a plasma discharge in a volume through which the ion beam passes for a predetermined time in a discharge phase, wherein the predetermined time is a function of a measured plasma density or a measured beam current.

16. The method of claim 15, wherein pulsing the plasma discharge to the ion beam comprises:
    introducing a gas in a path of the ion beam, and producing an energizing field that ionizes the gas creating a discharge to neutralize the ion beam.

17. The method of claim 16, wherein the energizing field is an electromagnetic field, and wherein producing the energizing field comprises activating the plasma discharge generator according to a duty cycle that is a function of a beam current of the ion beam generated.

18. The method of claim 15, further comprises generating magnetic cusp fields within the pulsed plasma generator to prolong the after glow phase, and wherein the predetermined time is a function of the plasma density of the discharge.

19. The method of claim 15, further comprising:
measuring at least one ion implantation characteristic; and
adjusting a timing of the activation of plasma discharge generator in response to at least one ion implantation characteristic measurement.

\* \* \* \* \*